United States Patent
Inoue et al.

(10) Patent No.: US 6,821,902 B2
(45) Date of Patent: Nov. 23, 2004

(54) ELECTROLESS PLATING LIQUID AND SEMICONDUCTOR DEVICE

(75) Inventors: Hiroaki Inoue, Machida (JP); Kenji Nakamura, Fujisawa (JP); Moriji Matsumoto, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/774,488

(22) Filed: Feb. 10, 2004

(65) Prior Publication Data

US 2004/0157441 A1 Aug. 12, 2004

Related U.S. Application Data

(62) Division of application No. 09/880,005, filed on Jun. 14, 2001, now Pat. No. 6,717,189.

(30) Foreign Application Priority Data

Jun. 1, 2001 (JP) ......................................... 2001-167355

(51) Int. Cl.$^7$ ........................................... H01L 21/302
(52) U.S. Cl. ....................... 438/704; 438/618; 438/627; 438/628; 438/659; 438/677; 438/678; 428/209; 428/901; 106/1.11
(58) Field of Search ............................... 438/618, 627, 438/628, 659, 677, 678; 428/209, 901; 106/1.11

(56) References Cited

U.S. PATENT DOCUMENTS

| | | | |
|---|---|---|---|
| 3,917,464 A | 11/1975 | Pearlstein et al. | |
| 3,929,483 A | 12/1975 | Wainer et al. | |
| 4,632,857 A | 12/1986 | Mallory, Jr. | |
| 4,659,587 A | * 4/1987 | Imura et al. | ................. 427/554 |
| H325 H | 9/1987 | Mallory et al. | |
| 5,240,497 A | 8/1993 | Bielski et al. | |
| 5,624,479 A | 4/1997 | Boecker et al. | |
| 5,695,810 A | 12/1997 | Dubin et al. | |
| 5,855,959 A | 1/1999 | Boecker et al. | |
| 6,191,530 B1 | * 2/2001 | Fukuta et al. | ................ 313/586 |

FOREIGN PATENT DOCUMENTS

EP    0 525 282    2/1993

* cited by examiner

Primary Examiner—David Nelms
Assistant Examiner—Mai-Huong Tran
(74) Attorney, Agent, or Firm—Wenderoth, Lind & Ponack, L.L.P.

(57) ABSTRACT

The present invention relates to an electroless-plating liquid useful for forming a protective film for selectively protecting surface of exposed interconnects of a semiconductor device which has an embedded interconnect structure formed by an electric conductor, such as copper or silver, embedded in fine recesses for interconnects formed in a surface of a semiconductor substrate, and also to a semiconductor device in which surfaces of exposed interconnects are selectively protected with a protective film. The electroless-plating liquid contains cobalt ions, a complexing agent and a reducing agent containing no alkali metal.

11 Claims, 7 Drawing Sheets

ELECTROLESS PLATING LIQUID AND SEMICONDUCTOR DEVICE

This application is a Divisional application of Ser. No. 09/880,005, filed Jun. 14, 2001, now U.S. Pat. No. 6,717, 189.

BACKGROUND OF THE INVENTION

1. Field of the Invention

This invention relates to an electroless-plating liquid and a semiconductor device. More particularly, this invention relates to an electroless-plating liquid useful for forming a protective film for selectively protecting surfaces of exposed interconnects of a semiconductor device which has an embedded interconnect structure formed from an electric conductor, such as copper or silver, filled in fine recesses for interconnects formed in a surface of a substrate such as a semiconductor substrate. This invention also relates to a semiconductor device in which a surface of exposed interconnects is selectively protected with a protective film.

2. Description of the Related Art

As a process for forming interconnects in a semiconductor device, a so-called "damascene process", which comprises filling trenches for interconnects and contact holes with a metal (electric conductor), is coming into practical use. According to this process, aluminum, or more recently, a metal such as copper or silver, is embedded into trenches for interconnects and contact holes previously formed in an interlevel dielectric of a semiconductor substrate. Thereafter, an extra metal is removed by chemical mechanical polishing (CMP) so as to flatten a surface of the substrate.

In a case of interconnects formed by such a process, embedded interconnects have an exposed surface after flattening processing. When an additional embedded interconnect structure is formed on such an interconnects-exposing surface of a semiconductor substrate, the following problems may be encountered. For example, during formation of a new $SiO_2$ layer during a subsequent interlevel dielectric forming process, exposed surfaces of pre-formed interconnects are likely to be oxidized. Further, upon etching of the $SiO_2$ layer for formation of via holes, the pre-formed interconnects exposed on bottoms of the via holes can be contaminated with an etchant, a peeled resist, or the like.

In order to avoid such problems, it has been conventional to form a protective film of SiN or the like, not only on a surface region of a semiconductor substrate where interconnects are exposed, but on an entire surface of the substrate, thereby preventing contamination of exposed interconnects with an etchant, or the like.

However, provision of a protective film of SiN or the like on the entire surface of a semiconductor substrate, in a semiconductor device having an embedded interconnect structure, increases a dielectric constant of an interlevel dielectric, thus inducing interconnect delaying even when a low-resistance material such as copper or silver is employed for interconnects whereby performance of the semiconductor device may be impaired.

In view of this, it has been proposed to selectively cover surfaces of exposed interconnects to protect the interconnects with an alloy film having good adhesion to an interconnect material such as copper or silver, and also having a low resistivity ($\rho$). The alloy film, for example, is obtained by performing electroless plating.

Provision of such a protective alloy film by performing electroless plating, however, has the following problems associated with sodium hypophosphite, which is generally used as a reducing agent during electroless plating:

① Inclusion of sodium in the reducing agent can cause alkali-metal contamination of the semiconductor device.

② When sodium hypophosphite is used as a reducing agent, it is not possible to apply an oxidizing electric current to copper or the like. This necessitates imparting a palladium catalyst to copper or the like, thus increasing an amount of process steps and decreasing throughput.

③ Impartment of a palladium catalyst to copper or the like, in principle, substitutes underlying interconnects of copper or the like by palladium, and causes formation of voids in the interconnects, thus lowering reliability of the interconnects.

④ Since palladium diffuses into copper or the like, impartment of a palladium catalyst increases electric resistance of the interconnects.

⑤ Besides on an interconnect formed region, plated film is likely to be deposited also on an insulating film, thereby making it difficult to perform intended selective plating.

SUMMARY OF THE INVENTION

The present invention has been made in view of the above drawbacks in the related art. It is therefore an object of the present invention to provide an electroless-plating liquid which can form a plated film (protective film) that selectively covers only surfaces of interconnects and protects exposed interconnects, without causing any alkali-metal contamination or formation of voids in the interconnects, and to provide a semiconductor device in which the exposed interconnects are selectively protected with a protective film.

In order to achieve the above object, the present invention provides an electroless-plating liquid for selectively forming a plated film on a surface of an exposed interconnect of a semiconductor device having an embedded interconnect structure, with the electroless-plating liquid comprising cobalt ions, a complexing agent, and a reducing agent free from alkali metal.

Use of the reducing agent free from alkali metal can prevent contamination of a semiconductor device with an alkali metal.

An alkylamine borane may be used as the reducing agent free from alkali metal. Use of such a reducing agent makes it possible to apply an oxidizing electric current to copper or a copper alloy, or to silver or a silver alloy, thus enabling a direct electroless plating. Further, use of an alkylamine borane, which is free from sodium, can prevent contamination of a semiconductor device with an alkali metal and, in addition, makes it possible to perform electroless plating without using a palladium catalyst.

Specific examples of the alkylamine borane include dimethylamine borane, diethylamine borane and trimethylamine borane.

The electroless-plating liquid may further contain at least one of a stabilizer selected from one or more kinds of heavy metal compounds and sulfur compounds, and a surfactant.

It is preferred that a pH of the electroless-plating liquid be adjusted to be within a range from 5 to 14 using a pH adjusting agent free from alkali metal. Use of an alkali metal-free pH adjusting agent, such as ammonia water or quaternary ammonium hydroxide, can keep the plating liquid free from sodium. The plating liquid preferably has a pH from 6 to 10.

The present invention also provides an electroless-plating liquid for selectively forming a plated film on a surface of an exposed interconnect of a semiconductor device having an embedded interconnect structure, with the electroless-plating liquid comprising cobalt ions, a complexing agent, a compound containing a refractory metal and a reducing agent free from alkali metal.

At least one of tungsten and molybdenum may be employed as the refractory metal. The reducing agent may be an alkylamine borane. By using such compounds, the electroless-plating liquid provides a protective film of a Co—W—B alloy, a Co—Mo—B alloy or a Co—Mo—W—B alloy to cover surfaces of exposed interconnects.

The present invention also provides a semiconductor device having an embedded interconnect structure of copper, copper alloy, silver or silver alloy interconnects, wherein a surface of an exposed interconnect is selectively covered with a protective film, with the protective film being formed by performing an electroless-plating process with use of an electroless-plating liquid that comprises cobalt ions, a complexing agent, and a reducing agent free from alkali metal.

By thus selectively covering surfaces of the interconnects and protecting the interconnects with the protective film of an alloy that has a high adhesion to silver or copper and has a low resistivity ($\rho$), increase in a dielectric constant of an interlevel dielectric of a semiconductor device having an embedded interconnect structure can be suppressed. Further, use of a low-resistance material as an interconnect material, such as silver or copper, can result in speedup and densification of a semiconductor.

The present invention also provides a semiconductor device having an embedded interconnect structure, wherein a surface of an exposed interconnect is selectively covered with a protective film of a metal comprising cobalt. The film preferably has a thickness within a range from 0.1 to 500 nm.

The present invention further provides a semiconductor device having an embedded interconnect structure, wherein a surface of an exposed interconnect is selectively covered with a protective film of an alloy comprising cobalt and a refractory metal. The refractory metal may preferably be at least one of tungsten and molybdenum.

Examples of the alloy include Co—B alloy, Co—P alloy, Co—W—B alloy, CO—W—P alloy, Co—Mo—B alloy, Co—Mo—P alloy, Co—W—Mo—B alloy, Co—W—Mo—P alloy, Co—Ti—B alloy, Co—Ti—P alloy, Co—Ta—B alloy, Co—Ta—P alloy, Co—Ti—Ta—B alloy, Co—Ti—Ta—P alloy, Co—Ti—W—B alloy, Co—Ti—W—P alloy, Co—Ti—Mo—B alloy, Co—Ti—Mo—P alloy, Co—Ti—Ta—B alloy, Co—Ti—Ta—P alloy, Co—Ta—W—B alloy, Co—Ta—W—P alloy, Co—Ta—Mo—B alloy, Co—Ta—Mo—P alloy, Co—Ti—W—Mo—B alloy, Co—Ti—W—Mo—P alloy, Co—Ta—W—Mo—B alloy, Co—Ta—W—Mo—P alloy, Co—Ti—Ta—W—Mo—B alloy and Co—Ti—Ta—W—Mo—P alloy.

DETAILED DESCRIPTION OF THE PREFERRED EMBODIMENTS

Preferred embodiments of the present invention will now be described with reference to the drawings.

Figure 1A:
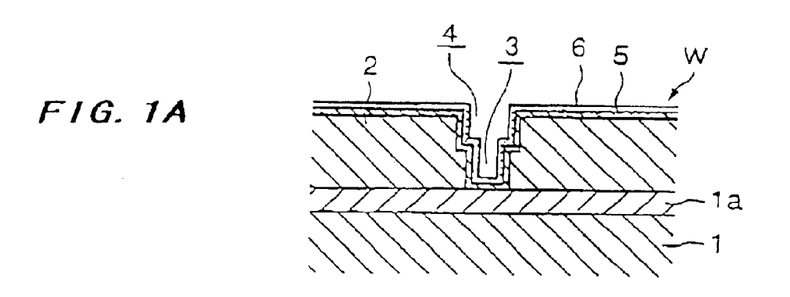
FIGS. 1A through 1C illustrate, in a sequence of process steps, an example of forming copper interconnects in a semiconductor device in accordance with the present invention.
Figure 1B:
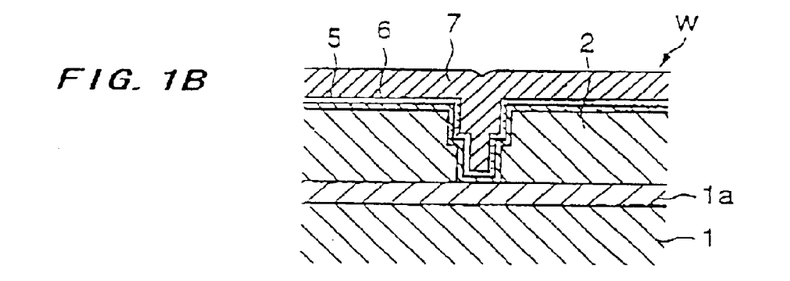
Figure 1C:
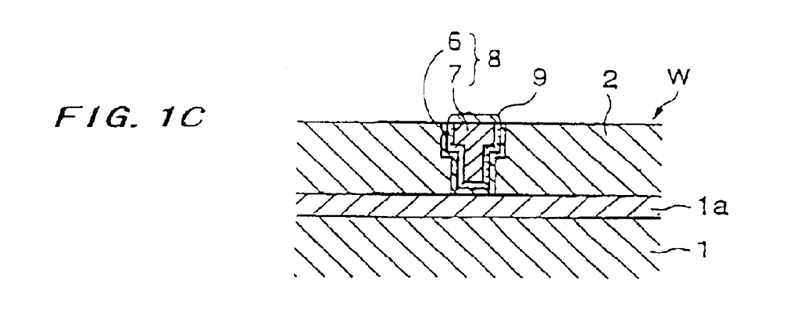

FIGS. 1A through 1C illustrate, in a sequence of process steps, an example of forming copper interconnects in a semiconductor device of the present invention. As shown in FIG. 1A, an insulating film 2 of $SiO_2$ is deposited on a conductive layer 1a formed on a semiconductor base 1 bearing semiconductor devices. A contact hole 3 and a trench 4 for interconnects are formed in the insulating film 2 by performing a lithography/etching technique. Thereafter, a barrier layer 5 of TaN or the like is formed on exposed surfaces of the conductive layer 1a and insulating film 2, and a copper seed layer 6 as an electric supply layer for electroplating is formed on the barrier layer 5 by performing sputtering or the like.

Then, as shown in FIG. 1B, copper plating is performed on to fill the contact hole 3 and the trench 4 with copper and, at the same time, deposit a copper film 7 on the insulating film 2. Thereafter, the copper film 7 on the insulating layer 2 is removed by performing chemical mechanical polishing (CMP) so as to make a surface of the copper filled in the contact hole 3 and the trench 4 and a surface of the insulating film 2 lie substantially in the same plane. Interconnects 8 composed of the copper seed layer 6 and the copper, as shown in FIG. 1C, are thus formed in the insulating layer 2.

Next, electroless plating is performed to selectively form a protective film 9 composed of an alloy film on exposed surfaces of the interconnects 8, thereby protecting the interconnects 8. Thickness of the protective film 9 is generally 0.1–500 nm, preferably 1–200 nm, more preferably 10–100 nm.

The protective film 9 is formed, for example, by using a plating liquid containing cobalt ions, a complexing agent, a pH buffer, a pH adjusting agent and an alkylamine borane as a reducing agent, or a plating liquid further containing a refractory (high-melting point) metal such as tungsten or molybdenum, and dipping the semiconductor substrate W in the plating liquid.

If desired, the plating liquid may further contain at least one of a stabilizer selected from one or more kinds of heavy metal compounds and sulfur compounds, and a surfactant. Further, the plating liquid is adjusted within a pH range of preferably 5–14, more preferably 6–10, by using a pH adjusting agent such as ammonia water or quaternary ammonium hydroxide. Temperature of the plating liquid is generally in a range of 30–90° C., preferably 40–80° C.

The protection of the interconnects 8 by provision of the protective film 9 can prevent, in forming thereon an additional embedded interconnect structure, oxidation of surfaces of the interconnects during formation of a new $SiO_2$ layer at a subsequent interlevel dielectric forming process and contamination of the interconnects with an etchant, a peeled resist or the like upon etching of the $SiO_2$ layer.

Use of the plating liquid containing cobalt ions, a complexing agent, a pH buffer, a pH adjusting agent and an alkylamine borane as a reducing agent, provides a protective film 9 of a Co—B alloy. Use of the plating liquid further containing a refractory metal, such as tungsten or molybdenum, provides a protective film 9 of a Co—W—B alloy, Co—Mo—B alloy or Co—Mo—W—B alloy.

By selectively covering the surfaces of the interconnects 8 and protecting the interconnects 8 with the protective film 9 of such an alloy that has a high adhesion to copper as an interconnect material and has a low resistivity ($\rho$), increase in a dielectric constant of an interlevel dielectric of a semiconductor device having an embedded interconnect structure can be suppressed. Further, use of copper as an interconnect material, which is a low-resistance material, can result in speedup and densification of the semiconductor.

Though this example shows use of copper as an interconnect material, a copper alloy, silver or a silver alloy may also be used.

The cobalt ions contained in the plating liquid may be supplied from a cobalt salt, for example, cobalt sulfate, cobalt chloride or cobalt acetate. An amount of the cobalt ions is generally in a range of 0.001–1 mol/L, preferably 0.01–0.3 mol/L.

Specific examples of the complexing agent may include carboxylic acids, such as acetic acid, and their salts; oxycarboxylic acids, such as tartaric acid and citric acid, and their salts; and aminocarboxylic acids, such as glycine, and their salts. These compounds may be used either singly or as a mixture of two or more. A total amount of the complexing agent is generally 0.001–1.5 mol/L, preferably 0.01–1.0 mol/L.

Regarding the pH buffer, any buffer may be used that does not contain sodium or any other alkali metal. Ammonium sulfate, ammonium chloride and boric acid are mentioned as specific examples. The pH buffer can be used generally in an amount of 0.01–1.5 mol/L, preferably 0.1–1 mol/L.

Regarding the pH adjusting agent, any agent may be used that does not contain sodium or any other alkali metal. Ammonia water and tetramethylammonium hydroxide (TMAH) are mentioned as specific examples. By using the pH adjusting agent, pH of the plating liquid is adjusted generally within a range of 5–14, preferably 6–10.

The reducing agent likewise should not contain sodium or any other alkali metal. An alkylamine borane is preferably used. As alkylamine boranes, dimethylamine borane (DMAB) and diethylamine borane, are mentioned. The reducing agent is used generally in an amount of 0.01–1 mol/L, preferably 0.01–0.5 mol/L.

Examples of compounds containing a refractory metal include tangstic acid, molybdic acid and their salts; and heteropoly acids, such as tangstophosphoric acid (e.g. H3(PW12 P40)üEnH2O), and their salts. Ti or Ta may also be used when formation of the protective film is not by performing electroless plating. A compound containing a refractory metal point is used generally in an amount of 0.001–1 mol/L, preferably 0.01–0.1 mol/L. Examples of cobalt/refractory metal alloys include Co—B alloy, Co—P alloy, Co—W—B alloy, Co—W—P alloy, Co—Mo—B alloy, Co—Mo—P alloy, Co—W—Mo—B alloy, Co—W—Mo—P alloy, Co—Ti—B alloy, Co—Ti—P alloy, Co—Ta—B alloy, Co—Ta—P alloy, Co—Ti—Ta—B alloy, Co—Ti—Ta—P alloy, Co—Ti—W—B alloy, Co—Ti—W—P alloy, Co—Ti—Mo—B alloy, Co—Ti—Mo—P alloy, Co—Ti—Ta—B alloy, Co—Ti—Ta—P alloy, Co—Ta—W—B alloy, Co—Ta—W—P alloy, Co—Ta—Mo—B alloy, Co—Ta—Mo—P alloy, Co—Ti—W—Mo—B alloy, Co—Ti—W—Mo—P alloy, Co—Ta—W—Mo—B alloy, Co—Ta—W—Mo—P alloy, Co—Ti—Ta—W—Mo—B alloy and Co—Ti—Ta—W—Mo—P alloy. Of these, alloys containing tungsten and/or molybdenum are especially preferred for use in the electroless plating according to the present invention. Alloys containing boran or phosphor are usable insofar as they contain no alkali metal. Alloys containing Ti or Ta may be used in a process other than electroless plating.

Besides the above described compounds, other known additives may be added to the plating liquid. Examples of usable additives include a bath stabilizer, which may be a heavy metal compound such as a lead compound, a sulfur compound such as a thiocyanate, or a mixture thereof, and a surfactant of an anionic, cationic or nonionic type.

As described above, it is preferred to use as a reducing agent an alkylamine borane free from sodium. Use of an alkylamine borone makes it possible to apply an oxidizing current to copper, a copper alloy, silver, or a silver alloy to thereby avoid need for imparting a palladium catalyst, thus enabling a direct electroless plating, and also to prevent contamination of a semiconductor device with an alkali metal. Thus, an electroless-plating liquid, which utilizes an alkylamine borane as a reducing agent, makes it possible to carry out electroless plating by immersing a surface of a semiconductor device W in the plating liquid, without imparting a palladium catalyst. This can reduce requisite process steps and increase throughput, prevent formation of voids in copper interconnects that would otherwise be caused by palladium replacement, and avoid increase in interconnect resistance that would be caused by palladium diffusion.

Further, it has been found that when electroless plating is performed by using a plating liquid containing the alkylamine borane as a reducing agent, a plating film is deposited selectively onto copper or silver. This enables a selective plating only onto interconnect regions.

Figure 2:
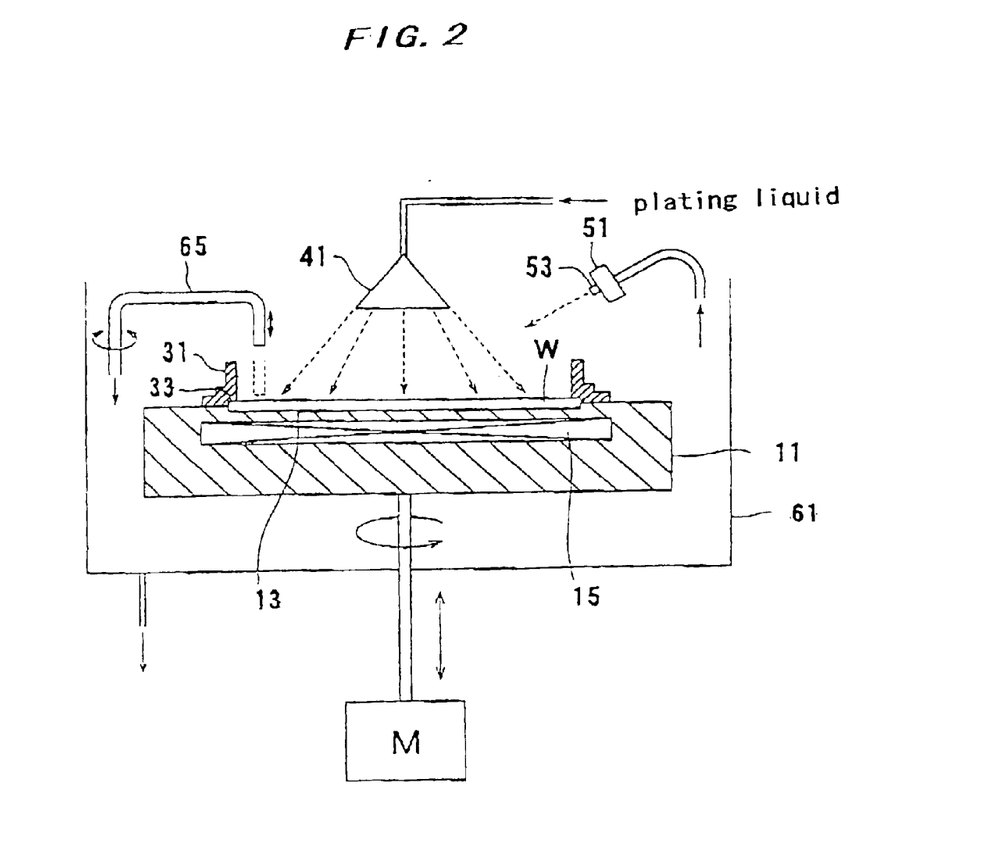
FIG. 2 is a schematic view of an example of an electroless-plating device.

FIG. 2 is a schematic constitution drawing of an electroless plating apparatus. As shown in FIG. 2, this electroless plating apparatus comprises a holding device 11 for holding a semiconductor substrate W on its upper surface, a dam member (plating liquid holding mechanism) 31 for contacting a peripheral edge portion of a surface to be plated (upper surface) of the semiconductor substrate W held by the holding device 11 to seal the peripheral edge portion, and a shower head (an electroless plating liquid (scattering) supply device) 41 for supplying a plating liquid (an electroless plating liquid) to the surface, to be plated, of the semiconductor substrate W having the peripheral edge portion sealed with the dam member 31. The electroless plating apparatus further comprises a cleaning liquid supply device 51 disposed near an upper outer periphery of the holding device 11 for supplying a cleaning liquid to the surface, to be plated, of the semiconductor substrate W, a recovery vessel 61 for recovering discharged cleaning liquid or the like (plating waste liquid), a plating liquid recovery nozzle 65 for sucking in and recovering plating liquid held on the semiconductor substrate W, and a motor (rotational drive device) M for rotationally driving the holding device 11.

The holding device 11 has a substrate placing portion 13 on its upper surface for receiving and holding the semiconductor substrate W. The substrate placing portion 13 is adapted to receive and fix the semiconductor substrate W. Specifically, the substrate placing portion 13 has a vacuum attracting mechanism (not shown) for attracting the semiconductor substrate W on a backside thereof by vacuum suction. A backside heater (heating device) 15, which is planar and heats the surface, to be plated, of the semiconductor substrate W from underneath to keep it warm, is installed on a backside of the substrate placing portion 13. The backside heater 15 is composed of, for example, a rubber heater. The holding device 11 is adapted to be rotated by the motor M and is movable vertically by a lifting device (not shown).

The dam member 31 is tubular, has a seal portion 33 provided at a lower portion thereof for sealing the outer peripheral edge of the semiconductor substrate W, and is installed so as not to move vertically from its illustrated position.

The shower head 41 is of a structure having many nozzles provided at a front end thereof for scattering supplied plating liquid in a shower form and supplying the liquid substantially uniformly to the surface, to be plated, of the semiconductor substrate W. The cleaning liquid supply device 51 has a structure for ejecting a cleaning liquid from a nozzle 53.

The plating liquid recovery nozzle 65 is adapted to be movable upwardly and downwardly and is swingable, and a front end of the plating liquid recovery nozzle 65 is adapted to be lowered inwardly of the dam member 31 located on the upper surface peripheral edge portion of the semiconductor substrate W so as to suck in plating liquid on the semiconductor substrate W.

Next, operation of the electroless plating apparatus will be described. First, the holding device 11 is lowered from its illustrated state to provide a gap of a predetermined dimension between the holding device 11 and the dam member 31, and a semiconductor substrate W is placed on and fixed to the substrate placing portion 13. An 8 inch wafer, for example, is used as the semiconductor substrate W.

Then, the holding device 11 is raised to bring its upper surface into contact with a lower surface of the dam member 31 as illustrated in FIG. 2, and an outer periphery of the semiconductor substrate W is sealed with the seal portion 33 of the dam member 31. At this time, a surface of the semiconductor substrate W is in an open state.

Then, the semiconductor substrate W itself is directly heated by the backside heater 15, while plating liquid is ejected from the shower head 41 to pour the plating liquid over substantially an entire surface of the semiconductor substrate W. Since the surface of the semiconductor substrate W is surrounded by the dam member 31, supplied plating liquid in its entirety is held on the surface of the semiconductor substrate W. An amount of the supplied plating liquid may be small so as to become 1 mm thick (about 30 ml) on the surface of the semiconductor substrate W. Thickness of plating liquid held on the surface to be plated may be 10 mm or less, and may even be 1 mm as in this embodiment. If a small amount of the supplied plating liquid is sufficient, the heating apparatus for heating the plating liquid may be of a small size.

If the semiconductor substrate W itself is adapted to be heated, temperature of the plating liquid, requiring great power consumption for being heated, need not be raised so high. This is preferred, because power consumption can be decreased, and a change in properties of the plating liquid can be prevented. Power consumption for heating of the semiconductor substrate W itself may be small, and the amount of the plating liquid stored on the semiconductor substrate W is also small. Thus, heat retention of the semiconductor substrate W by the backside heater 15 can be performed easily, and capacity of the backside heater 15 may be small, and the apparatus can be made compact. If a device for directly cooling the semiconductor substrate W itself is used, switching between heating and cooling may be performed during plating to change plating conditions. Since the plating liquid held on the semiconductor substrate is of a small amount, temperature control can be performed with good sensitivity.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating liquid. Then, the semiconductor substrate W is kept stationary, and electroless plating is performed for 1 minute. The instantaneous rotating time is at most 10 seconds or less.

After completion of the plating, the front end of the plating liquid recovery nozzle 65 is lowered to an area near an inside of the dam member 31 on the peripheral edge portion of the semiconductor substrate W to suck in plating liquid. At this time, if the semiconductor substrate W is rotated at a rotational speed of, for example, 100 rpm or less, the plating liquid remaining on the semiconductor substrate W can be gathered at a portion of the dam member 31 on the peripheral edge portion of the semiconductor substrate W via centrifugal force, so that recovery of the plating liquid can be performed with good efficiency and a high recovery rate. The holding device 11 is lowered to separate the semiconductor substrate W from the dam member 31. The semiconductor substrate W is started to be rotated, and cleaning liquid (ultrapure water) is jetted at the plated surface of the semiconductor substrate W from the nozzle 53 of the cleaning liquid supply device 51 to cool the plated surface, and simultaneously perform dilution and cleaning, thereby stopping an electroless plating reaction. At this time, the cleaning liquid jetted from the nozzle 53 may be supplied to the dam member 31 to perform cleaning of the dam member 31. Plating waste liquid at this time is recovered into the recovery vessel 61 and discarded.

Plating liquid once used is not reused, and is discarded. As stated above, the amount of the plating liquid used in this apparatus can be made very small, compared with that in the prior art. Thus, the amount of the plating liquid which is discarded is small, even without reuse. In some cases, the plating liquid recovery nozzle 65 may not be installed, and plating liquid which has been used may be recovered as a plating waste liquid into the recovery vessel 61, together with the cleaning liquid.

Then, the semiconductor substrate W is rotated at a high speed by the motor M for spin-drying, and then the semiconductor substrate W is removed from the holding device 11.

Figure 3:
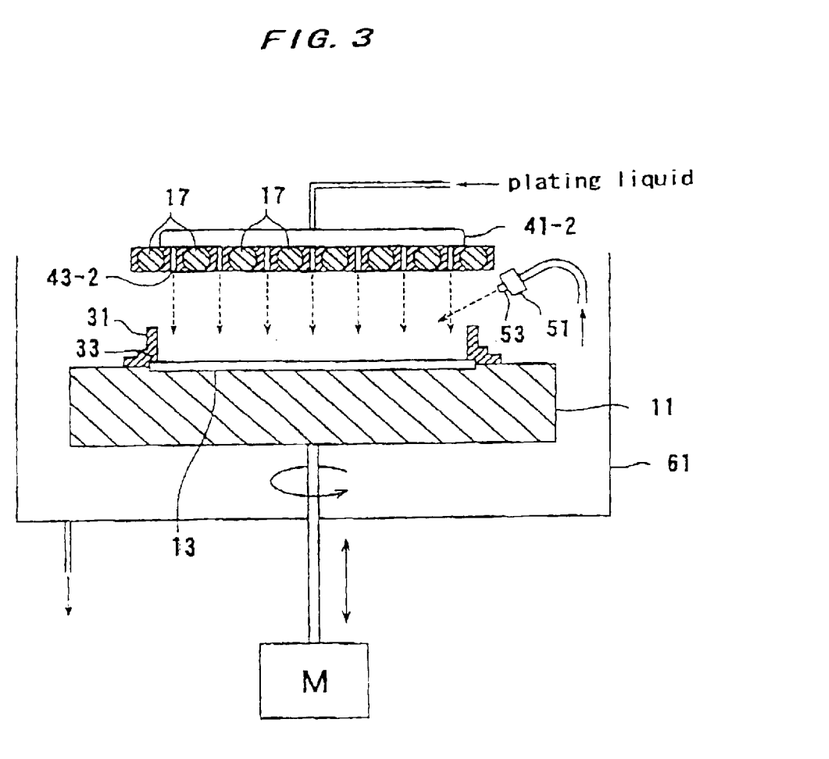
FIG. 3 is a schematic view of another example of an electroless-plating device.

FIG. 3 is a schematic constitution drawing of another electroless plating apparatus. The embodiment of FIG. 3 is different from the aforementioned electroless plating apparatus shown in FIG. 2 in that instead of providing the backside heater 15 in the holding device 11, lamp heaters (heating devices) 17 are disposed above holding device 11, and the lamp heaters 17 and a shower head 41-2 are integrated. For example, a plurality of ring-shaped lamp heaters 17 having different radii are provided concentrically, and many nozzles 43-2 of the shower head 41-2 are open in a ring form from gaps between the lamp heaters 17. The lamp heaters 17 may be composed of a single spiral lamp heater, or may be composed of other lamp heaters of various structures and arrangements.

Even with this constitution, plating liquid can be supplied from each nozzle 43-2 to a surface, to be plated, of a semiconductor substrate W substantially uniformly in a shower form. Further, heating and heat retention of the semiconductor substrate W can be uniformly performed directly by the lamp heaters 17. The lamp heaters 17 heat not only the semiconductor substrate W and the plating liquid, but also ambient air, thus exhibiting a heat retention effect on the semiconductor substrate W.

Direct heating of the semiconductor substrate W by the lamp heaters 17 requires lamp heaters of relatively large power consumption. In place of such lamp heaters, lamp heaters with relatively small power consumption and the backside heater 15 shown in FIG. 2 may be used in combination to heat the semiconductor substrate W mainly with the backside heater and to perform heat retention of the plating liquid and ambient air mainly by the lamp heaters. In the same manner as in the aforementioned embodiment, a device for directly or indirectly cooling the semiconductor substrate W may be provided to perform temperature control.

Figure 4:
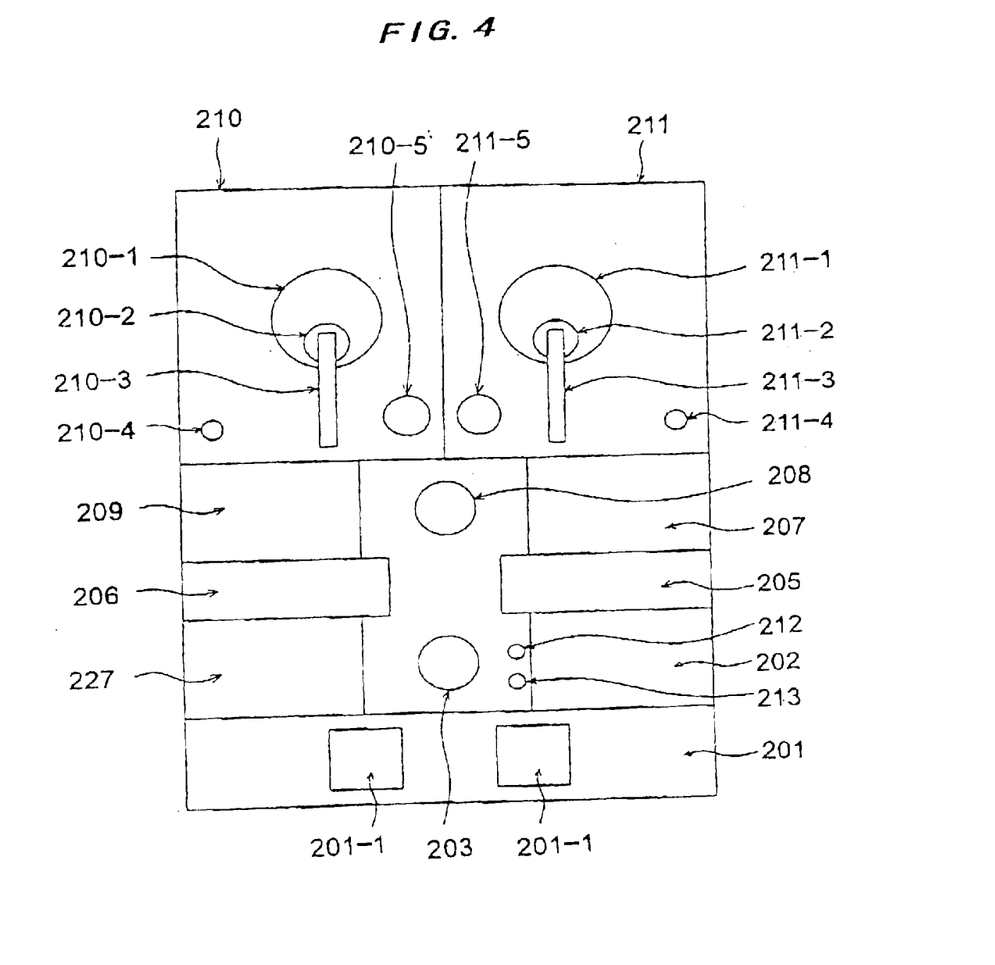
FIG. 4 is a plan view of an example of a semiconductor producing apparatus for producing a semiconductor device in accordance with the present invention.

FIG. 4 is a plan view of an example of a semiconductor producing apparatus for producing a semiconductor device in accordance with the present invention. The semiconductor producing apparatus includes a loading/unloading section 201 housing cassettes 201-1, a first plating device 202, a first robot 203, reversing devices 205 and 206, a second cleaning device 207, a second robot 208, a first cleaning device 209, a second plating device 227, a first polishing device 210 and a second polishing device 211. Further, in the vicinity of the first robot 203, a before/after plating-film thickness-measuring device 212 for measuring thickness of a plated film before and after plating, and a dry state film thickness-measuring device 213 for measuring thickness of a dry-state film on the semiconductor substrate W after polishing, are provided.

The first polishing device 210 has a polishing table 210-1, a top ring 210-2, a top ring head 210-3, a film thickness-measuring device 210-4 and a pusher 210-5. The second polishing device 211 has a polishing table 211-1, a top ring 211-2, a top ring head 211-3, a film thickness-measuring device 211-4 and a pusher 211-5.

Process steps performed by the apparatus will now be described.

First, a cassette 201-1 housing semiconductor substrates W, on each of which is formed a copper seed layer 6 (see FIG. 1A), is placed on a loading port in the loading/unloading section 201. A semiconductor substrate is removed by the first robot 203, and a copper film 7 (see FIG. 1B) is formed by the first plating device 202. Formation of the copper film 7 is performed by carrying out hydrophilic treatment of a face of the semiconductor substrate W, and then performing copper plating. Then, rinsing or cleaning is performed. If there is some time to spare, drying may be performed. When the semiconductor substrate W is removed by the first robot 203, film thickness of the plated copper film 7 is measured with the before/after plating-film thickness-measuring instrument 212. Results of this measurement are recorded as record data of the semiconductor substrate W and are also used for judgment of an abnormality of the first plating-device 202. After measurement of the film thickness, the first robot 203 transfers the semiconductor substrate W to the reversing device 205 by which the semiconductor substrate W is turned over.

Then, the second robot 208 picks up the semiconductor substrate W from the reversing device 205, and places the substrate on pusher 210-5 or 211-5. Then, top ring 210-2 or 211-2 holds the semiconductor substrate W by suction, transfers the substrate onto polishing table 210-1 or 211-1, and presses the substrate against a polishing surface on the polishing table 210-1 or 211-1 to perform polishing.

After completion of polishing, the top ring 210-2 or 211-2 returns the semiconductor substrate W to the pusher 210-5 or 211-5. The second robot 208 picks up the semiconductor substrate W, and carries the substrate into the first cleaning device 209. At this time, a chemical liquid may be ejected toward the face and backside of the semiconductor substrate W to, remove particles therefrom or make it difficult for particles to adhere thereto.

In the first cleaning device 209, the face and the backside of the semiconductor substrate W are scrubbed and cleaned. The face of the semiconductor substrate W is scrubbed and cleaned, mainly for removal of particles, with a PVA roll sponge using cleaning water comprising pure water to which a surface active agent, a chelating agent, or a pH adjusting agent is added. A strong chemical liquid such as DHF is ejected toward the backside of the semiconductor substrate W to etch diffused copper. If there is no problem of copper diffusion, the backside of the semiconductor substrate W is scrubbed and cleaned with a PVA roll sponge using the same chemical liquid as that for the face.

After cleaning, the second robot 208 picks up the semiconductor substrate W, and transfers the substrate to the reversing device 206 where the semiconductor substrate W is reversed. The second robot 208 again picks up the semiconductor substrate W and transports the substrate to the second plating device 227 which is constituted, for example, by the electroless-plating device as shown in FIG. 2 or FIG. 3. In the second plating device 227, a surface of the semiconductor substrate W is immersed in a plating liquid, e.g. the above described electroless-plating liquid, and a protective film 9 of an alloy is selectively formed on exposed surfaces of interconnects 8 to protect the interconnects 8 (see FIG. 1C). Thereafter, the second robot 208 picks up the semiconductor substrate W, transfers the substrate to the reversing device 206, where the semiconductor substrate W is reversed, and then transfers the substrate to the second cleaning device 207. In the second cleaning device 207, megasonic water, to which ultrasonic vibrations are applied, is ejected toward a face of the semiconductor substrate W to clean the face. At this time, the face may be cleaned with a pencil type sponge using a cleaning liquid comprising pure water to which a surface active agent, a chelating agent, or a pH adjusting agent is added. Thereafter, the semiconductor substrate W is dried by spin-drying.

Then, the second robot 208 picks up the semiconductor substrate W, and transfers the substrate to the reversing device 206 as it is. The first robot 203 removes the semiconductor substrate W from the reversing device 206. In a case where film thickness has been measured with film thickness measuring instrument 210-4 or 211-4 provided near the polishing table 210-1 or 211-1 the semiconductor substrate W is received by cassette 201-1 placed in an unload port of the loading/unloading section 201. In a case where film thicknesses of multilayer films are to be measured, measurement in a dry state needs to be performed. Thus, film thickness is measured once with the dry state film thickness-measuring instrument 213.

Figure 5:
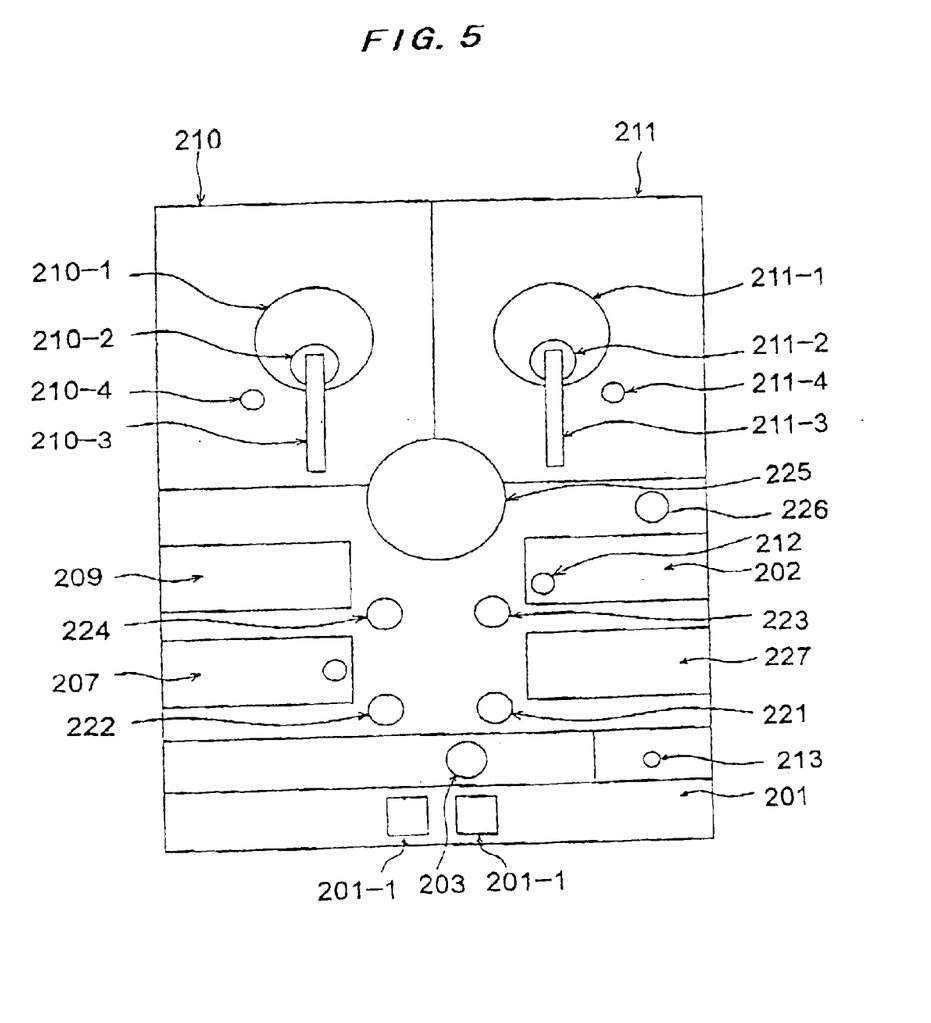
FIG. 5 is a plan view of another example of a semiconductor producing apparatus for producing a semiconductor device in accordance with the present invention.

FIG. 5 is a plan view of another example of a semiconductor producing apparatus for producing a semiconductor device in accordance with the present invention. As with the substrate-processing apparatus of FIG. 4, this semiconductor producing apparatus performs substrate processing comprising steps of forming copper film 7 on semiconductor substrate W having thereon seed layer 6, polishing the substrate, and selectively forming protective film 9 on interconnects 8, thereby providing a circuit interconnection in which the interconnects 8 are selectively protected with the protective film 9.

In the present semiconductor producing apparatus, a pusher indexer 225 is disposed close to first polishing apparatus 210 and second polishing apparatus 211, substrate placing tables 221, 222 are disposed close to second cleaning device 207 and second plating device 227, respectively, and a robot 223 (hereinafter referred to as second robot 223) is disposed close to the second plating device 227 and first plating device 202. Further, a robot 224 (hereinafter referred to as third robot 224) is disposed close to first cleaning device 209 and the second cleaning device 207, and dry state film thickness-measuring instrument 213 is disposed close to loading/unloading section 201 and first robot 203.

The first robot 203 removes a semiconductor substrate W having a seed layer 6 thereon from a cassette 201-1 placed on a load port of the loading/unloading section 201, and places the substrate on the substrate placing table 221. Then, the second robot 223 transports the semiconductor substrate W to the first plating device 202 where a copper film 7 (see FIG. 1B) is formed. The second robot 223 transfers the semiconductor substrate having the copper film 7 formed thereon which is to be measured by the before/after plating-film thickness-measuring instrument 212. After measurement of the film thickness, the semiconductor substrate is carried to and placed on the pusher indexer 225.

Top ring 210-2 or 211-2 holds the semiconductor substrate W on the pusher indexer 225 by suction, and transfers the substrate to polishing table 210-1 or 211-1 to perform polishing. After polishing, the top ring 210-2 or 211-2 transfers the semiconductor substrate W to film thickness measuring instrument 210-4 or 211-4 to measure film thickness. Then, the top ring 210-2 or 211-2 transfers the semiconductor substrate W to the pusher indexer 225, and places the substrate thereon.

Then, the third robot 224 picks up the semiconductor substrate W from the pusher indexer 225, and carries the substrate into the first cleaning device 209. After cleaning in the first cleaning unit 209, the third robot 224 picks up the cleaned semiconductor substrate W, and carries the substrate into the second plating device 227 where protective film 9 is selectively formed on surfaces of interconnects 8 by e.g. electroless plating, thereby protecting the interconnects 8 (see FIG. 1C). Thereafter, the third robot 224 carries the semiconductor substrate W into the second cleaning device 207 for cleaning and drying, and places the cleaned semiconductor substrate W on the substrate placing table 222. Next, the first robot 203 picks up the semiconductor substrate W and carries it to the dry state film thickness-measuring instrument 213 where film thickness is measured, and then puts the substrate into a cassette 201-1 placed on an unload port in the loading/unloading section 201.

Figure 6:
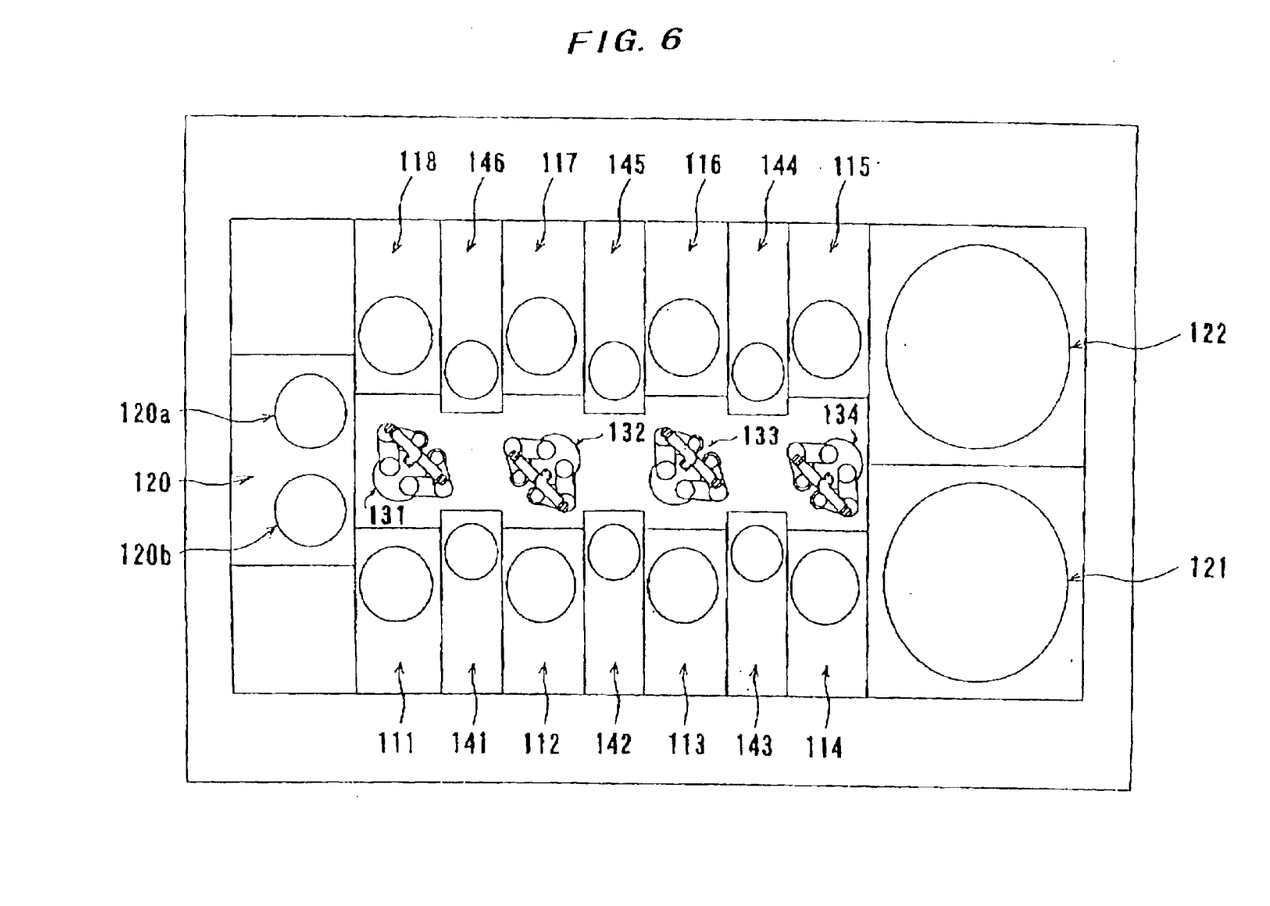
FIG. 6 is a plan view of yet another example of a semiconductor producing apparatus for producing a semiconductor device in accordance with the present invention.

FIG. 6 is a plan view of yet another example of a semiconductor producing apparatus for producing a semiconductor device in according with the present invention. In the present semiconductor producing apparatus, there are provided a barrier layer forming unit 111, a seed layer forming unit 112, a plated film forming unit 113, an annealing unit 114, a first cleaning unit 115, a bevel and backside cleaning unit 116, a cap plating unit 117 having e.g. an electroless-plating device shown in FIG. 2 or FIG. 3, a second cleaning unit 118, a first aligner and film thickness measuring instrument 141, a second aligner and film thickness measuring instrument 142, a first substrate reversing device 143, a second substrate reversing device 144, a substrate temporary placing table 145, a third film thickness measuring instrument 146, a loading/unloading unit 120, a first polishing apparatus 121, a second polishing apparatus 122, a first robot 131, a second robot 132, a third robot 133, and a fourth robot 134. The film thickness measuring instruments 141, 142, and 146 are units that have the same frontage dimension as that of other units (plating, cleaning, annealing units, and the like), and are thus interchangeable.

In this embodiment, an electroless Ru plating apparatus can be used as the barrier layer forming unit 111, an electroless copper plating apparatus can be used as the seed layer forming unit 112, and an electroplating apparatus can be used as the plated film forming unit 113.

Process steps performed by this apparatus will now be described.

First, a semiconductor substrate removed by the first robot 131 from a cassette 120a placed on the loading/unloading unit 120 is placed in the first aligner and film thickness measuring unit 141, in such a state that its surface, to be plated, faces upwardly. In order to set a reference point for a position at which film thickness measurement is made, notch alignment for film thickness measurement is performed, and then film thickness data of the semiconductor substrate before formation of a copper film is obtained.

Then, the semiconductor substrate is transported to the barrier layer forming unit 111 by the first robot 131. The barrier layer forming unit 111 is such an apparatus for forming a barrier layer on the semiconductor substrate by electroless Ru plating, and the barrier layer forming unit 111 forms an Ru film as a film for preventing copper from diffusing into an interlayer insulator film (e.g. $SiO_2$) of a semiconductor device. The semiconductor substrate discharged after cleaning and drying steps is transported by the first robot 131 to the first aligner and film thickness measuring unit 141, where film thickness of the semiconductor substrate, i.e., film thickness of the barrier layer is measured.

The semiconductor substrate after film thickness measurement is carried into the seed layer forming unit 112 by the second robot 132, and a seed layer 6 (see FIG. 1A) is formed on the barrier layer by electroless Cu plating. The semiconductor substrate discharged after cleaning and drying steps is transported by the second robot 132 to the second aligner and film thickness measuring instrument 142 for determination of a notch position, before the semiconductor substrate is transported to the plated film forming unit 113, and then notch alignment for copper plating is performed. If necessary, film thickness of the semiconductor substrate before formation of a copper film may be measured again by the second aligner and film thickness measuring instrument 142.

The semiconductor substrate which has completed notch alignment is transported by the third robot 133 to the plated film forming unit 113 where copper plating is applied to the semiconductor substrate. The semiconductor substrate discharged after cleaning and drying steps is transported by the third robot 133 to the bevel and backside cleaning unit 116 where an unnecessary copper film (seed layer) at a peripheral portion of the semiconductor substrate is removed. In the bevel and backside cleaning unit 116, the bevel is etched for a preset time, and copper adhering to a backside of the semiconductor substrate is cleaned with a chemical liquid such as hydrofluoric acid. At this time, before transporting the semiconductor substrate to the bevel and backside cleaning unit 116, film thickness measurement of the semiconductor substrate may be made by the second aligner and film thickness measuring instrument 142 to obtain a thickness value of a copper film formed by plating, and based on obtained results, a bevel etching time may be changed arbitrarily to carry out etching. A region etched by performing bevel etching is a region which corresponds to a peripheral edge portion of the substrate and has no circuit formed therein, or a region which is not utilized finally as a chip although a circuit is formed therein. A bevelled portion is included in this region.

The semiconductor substrate discharged after cleaning and drying steps in the bevel and backside cleaning unit 116 is transported by the third robot 133 to the substrate reversing device 143. After the semiconductor substrate is turned over by the substrate reversing device 143 to cause the plated surface to be directed downwardly, the semiconductor substrate is introduced into the annealing unit 114 by the fourth robot 134 for thereby stabilizing an interconnect portion. Before and/or after performing an annealing treatment, the semiconductor substrate is carried into the second aligner and film thickness measuring unit 142 where film thickness of copper film 7 (see FIG. 1B) formed on the semiconductor substrate is measured. Then, the semiconductor substrate is carried by the fourth robot 134 into the first polishing apparatus 121 in which the copper film 7 and the seed layer 6 (see FIG. 1A) of the semiconductor substrate are polished.

At this time, desired abrasive grains or the like are used, but a fixed abrasive may be used in order to prevent dishing and enhance flatness of a face of the semiconductor substrate. After completion of this primary polishing, the semiconductor substrate is transported by the fourth robot 134 to the first cleaning unit 115 where the substrate is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of this primary cleaning, the semiconductor substrate is transported by the fourth robot 134 to the second polishing apparatus 122 where the barrier layer 5 on the semiconductor substrate is polished. At this time, desired abrasive grains or the like are used, but a fixed abrasive may be used in order to prevent dishing and enhance flatness of a face of the semiconductor substrate. After completion of this secondary polishing, the semiconductor substrate is transported by the fourth robot 134 again to the first cleaning unit 115 where scrub-cleaning is performed. After completion of this cleaning, the semiconductor substrate is transported by the fourth robot 134 to the second substrate reversing device 144 where the semiconductor substrate is reversed to cause the plated surface to be directed upwardly, and then the semiconductor substrate is placed on the substrate temporary placing table 145 by the third robot.

The semiconductor substrate is transported by the second robot 132 from the substrate temporary placing table 145 to the cap plating unit 117 where nickel-boron plating (cap plating), for example, is applied onto surfaces of interconnects 8 for a purpose of preventing oxidation of copper due to exposure to the atmosphere. The semiconductor substrate, in which protective film 9 (see FIG. 1C) has been formed on surfaces of the interconnects 8 by cap plating to protect the interconnects 8, is transferred by the second robot 132 to the third film thickness measuring device 146 where thickness of the copper film is measured. Thereafter, the semiconductor substrate is transferred by the first robot 131 to the second cleaning unit 118 where the substrate is cleaned with pure water or deionized water. The cleaned semiconductor substrate is returned to the cassette 120*a* in the loading/unloading unit 120.

EXAMPLE

Holes having a size of 0.5 $\mu$m×0.5 $\mu$m depth (aspect ratio: 1.0) were formed at a predetermined pitch in insulating film. After filling the holes with copper, a surface was flattened by a CMP treatment to prepare a sample (semiconductor wafer) having a size of 3 cm×4 cm (with 6-pattern formation). The sample was subjected to electroless plating at a bath load of 200 ml/chip using a plating liquid having a composition shown in the following Table 1.

TABLE 1

| | |
|---|---|
| $CoSO_4.7H_2O$ | 28.1 g/L |
| L-tartaric acid | 82.5 g/L |
| $(NH_4)_2SO_4$ | 39.6 g/L |
| DMAB | 1.5 g/L |
| TMAH | 455 ml/L |
| $H_2WO_4$ | 5.0 g/L |
| PH | 9.0 |
| Temperature | 80° C. |

After completion of electroless plating, the sample was washed and dried. When the sample was observed under an SEM, it was found that a plated Co—W—B film grew selectively in a pattern formation region. A growth rate of plated film was about 100 nm/min; and the plated film was analyzed as follows:

Co: about 98.4 atomic %, W: about 1.0 atomic %, B: about 0.6 atomic %

Figure 7A:
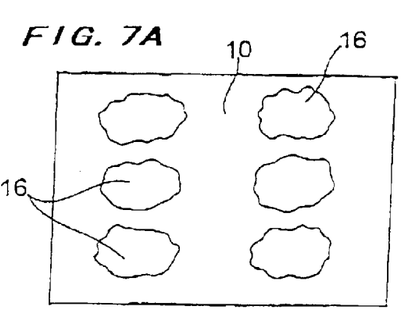
FIGS. 7A and 7B are diagrams of SEM photographs of a test sample obtained in an example.
Figure 7B:
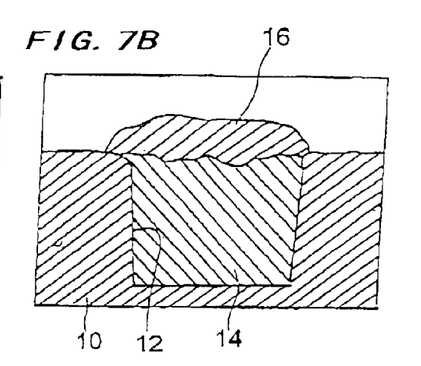

FIGS. 7A and 7B are diagrams of SEM photographs of the sample. As shown in the Figures, there is no formation of voids within copper 14 embedded in hole 12 formed in insulating layer 10. Further, only a surface of the copper 14, i.e. a surface of interconnects, is covered with protective film 16 of plated Co—W—B, without deposition of the Co—W—B film on a surface of the insulating layer 10, indicating high selectivity of plating.

Comparative Example

The same sample as used in the Example was prepared. This sample was first immersed in a solution of $PdCl_2$ (0.005 g/L)+HCl(0.2 ml/L) at 25° C. for one minute to impart a palladium catalyst to the sample. Next, the palladium-imparted sample was immersed in a plating liquid at 90° C. having a composition shown in the following Table 2, and electroless plating was performed at a bath load of 200 ml/chip.

TABLE 2

| | |
|---|---|
| $CoCl_2.6H_2O$ (g/L) | 30 |
| $(NH_4)_2.WO_4$ (g/L) | 10 |
| $Na_3C_6H_5O_7.2H_2O$ (g/L) | 80 |
| $NaH_2PO_2.H_2O$ (g/L) | 20 |
| PH | pH = 10 with NaOH |

After completion of electroless plating, the sample was washed and dried. When the sample was observed under an SEM, it was found that a plated Co—W—P film grew selectively in a pattern formation region. A growth rate of the plated film was about 70 nm/min; and the plated film was analyzed as follows:

Co: about 89 atomic %, W: about 5 atomic %, P: about 6 atomic %

Figure 8A:
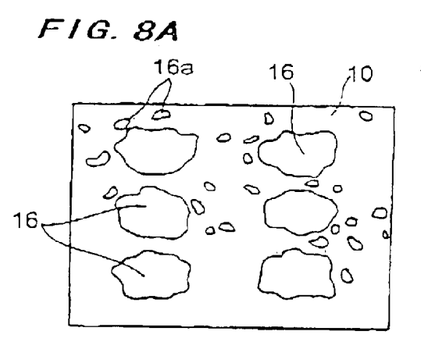
FIGS. 8A and 8B are diagrams of SEM photographs of a test sample obtained in a comparative example.
Figure 8B:
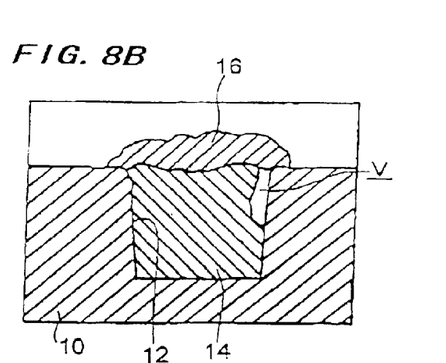

FIGS. 8A and 8B are diagrams of SEM photographs of the sample. As shown in the Figures, a void V is formed within copper 14 embedded in hole 12 formed in insulating layer 10. Further, not only a surface of the copper 14, i.e. a surface of interconnects, is covered with protective film 16 of a plated Co—W—P alloy, but alloy film 16a is deposited also onto a surface of the insulating layer 10 around the hole 12, i.e. a region of unnecessary protection, thus indicating poor selectivity of plating.

According to the present invention, as described hereinabove, use of an alkylamine borane free from sodium as a reducing agent makes it possible to apply an oxidizing current to e.g. copper, a copper alloy, silver, or a silver alloy to thereby avoid a need for imparting a palladium catalyst, thus enabling direct electroless plating, and also to prevent contamination of a semiconductor device with an alkali metal. This can reduce requisite process steps and increase throughput, prevent formation of voids in interconnects, thereby enhancing reliability, and avoid increase in interconnect resistance caused by palladium diffusion.

Moreover, use of a plating liquid containing an alkylamine borane as a reducing agent enables selective plating only onto an interconnect region.

What is claimed is:

1. A method of forming a semiconductor device, comprising:
   providing a trench in a surface of an insulating film on a substrate, wherein said trench is covered by a barrier layer and a seed layer on said barrier layer;
   depositing a metal film in said trench so as to form an embedded interconnect; and
   while rotating said substrate, electrolessly plating a protective film having a thickness in a range of from 0.1 nm to 500 nm onto a surface of said embedded interconnect using an electroless-plating liquid without using palladium, said electroless-plating liquid comprising:
   (i) cobalt ions;
   (ii) a complexing agent; and
   (iii) an alkylamine borane that is free from alkali metal.

2. The method according to claim 1, further comprising polishing a surface of said metal film before said electrolessly plating.

3. The method according to claim 1, wherein said electroless-plating liquid further comprises at least one of
   (i) a stabilizer selected from one or more kinds of heavy metal compounds and sulfur compounds, and
   (ii) a surfactant.

4. The method according to claim 1, wherein said electroless-plating liquid has a pH adjusting agent that is free from alkali metal.

5. The method according to claim 1, wherein said protective film has a thickness within a range of from 10 nm to 100 nm.

6. A method of forming a semiconductor device, comprising:
   providing a trench in a surface of an insulating film on a substrate, wherein said trench is covered by a barrier layer and a seed layer on said barrier layer;
   depositing a metal film in said trench so as to form an embedded interconnect; and
   while rotating said substrate, electrolessly plating a protective film having a thickness in a range of from 0.1 nm to 500 nm onto a surface of said embedded interconnect using an electroless-plating liquid without using palladium, said electroless-plating liquid comprising:
   (i) cobalt ions;
   (ii) a complexing agent;
   (iii) a compound containing a refractory metal; and
   (iv) an alkylamine borane that is free from alkali metal.

7. The method according to claim 6, further comprising polishing a surface of said metal film before said electrolessly plating.

8. The method according to claim 6, wherein said refractory compound comprises at least one of tungsten and molybdenum.

9. The method according to claim 6, wherein said electroless-plating liquid further comprises at least one of
   (i) a stabilizer selected from one or more kinds of heavy metal compounds and sulfur compounds, and
   (ii) a surfactant.

10. The method according to claim 6, wherein said electroless-plating liquid has a pH adjusting agent that is free from alkali metal.

11. The method according to claim 6, wherein said protective film has a thickness within a range of from 10 nm to 100 nm.

* * * * *